United States Patent [19]

Pennisi et al.

[11] Patent Number: 5,128,746
[45] Date of Patent: Jul. 7, 1992

[54] ADHESIVE AND ENCAPSULANT MATERIAL WITH FLUXING PROPERTIES

[75] Inventors: Robert W. Pennisi, Boca Raton; Marc V. Papageorge, Plantation, both of Fla.

[73] Assignee: Motorola, Inc., Schaumburg, Ill.

[21] Appl. No.: 588,888

[22] Filed: Sep. 27, 1990

[51] Int. Cl.$^5$ .................. H01L 23/14; H01L 23/30
[52] U.S. Cl. ........................... 357/72; 357/80
[58] Field of Search ............ 357/72, 80; 156/330, 156/331.8, 335; 106/123, 186, 189, 153, 136; 252/512; 528/8, 114

[56] References Cited

U.S. PATENT DOCUMENTS

| | | | |
|---|---|---|---|
| 4,448,847 | 5/1984 | Bell et al. | 156/330 |
| 4,604,644 | 8/1986 | Beckham et al. | 357/72 |
| 4,855,001 | 8/1989 | Damico et al. | 156/330 |
| 4,980,086 | 12/1990 | Hiraiwa et al. | 252/512 |

OTHER PUBLICATIONS

Gabrykewicz, Sangupta, Thuruthumely and Frazee, "Glob top Material Selection for Flip Chip Devices", Proceedings of the 1986 International Symposium for Microelectronics, 1986, pp. 707-713.

Primary Examiner—Andrew J. James
Assistant Examiner—S. V. Clark
Attorney, Agent, or Firm—Daniel K. Nichols; Dale W. Dorinski

[57] ABSTRACT

An adhesive material 120 including a fluxing agent is applied to either a substrate 100 having a metallization pattern 110 or a solder bumped electrical component 130. The component 130 is positioned on the substrate 110 and the solder bump 140 is reflowed. During the reflow step, the fluxing agent promotes adhesion of the solder 140 to the substrate metallization pattern 110, and the adhesive material 120 is cured to mechanically interconnect and encapsulate the substrate 110 to the component 130.

12 Claims, 1 Drawing Sheet

ADHESIVE AND ENCAPSULANT MATERIAL WITH FLUXING PROPERTIES

TECHNICAL FIELD

This invention relates generally to electronic circuitry, and more particularly to electrical interconnection methods, and most particularly to flip chip attachment and encapsulation of integrated circuits.

BACKGROUND

The solder bump interconnection was developed to eliminate the expense, unreliability, and low productivity of manual wire bonding. Solder bump interconnection technology for flip chip integrated circuits has been practiced in one form or another for approximately 20 years. Whereas the initial, low complexity integrated circuits typically had peripheral contacts, the flip chip bumping technology has allowed considerable increase in interconnect density as it progressed to full population area arrays. The controlled collapse chip connection utilizes solder bumps deposited on wettable metal terminals on the die and a matching footprint of solder wettable terminals on the substrate. The upside down integrated circuit (flip chip) is aligned to the substrate and all joints are made simultaneously by reflowing the solder. In the controlled collapse method, a bump of solder is deposited on the terminals of the integrated circuit, and the solder bump is restrained from flowing out on the terminals by using thick film glass dams, limiting solder flow to the tip of the substrate metallization. Similarly, the flow of solder on the integrated circuit is limited by the size of the solderable pad on metal exposed in the covering surface of chemically vapor deposited glass passivation on the integrated circuit.

Selection of the solder alloy has been defined on the basis of melting point. High lead solders have been used when bonding the integrated circuit to alumina ceramic substrates because of the high melting point of the alloy, allowing further processing of the assembled circuit. Joining to organic carriers such as epoxy or polyimide circuit boards requires lower melting solder alloys. Solders such as eutectic tin/lead solder (melting point 183° C.) or lead/indium solder (melting point 220° C.) have been used.

The choice of terminal metallurgy depends on the solder selected. Silver and gold are poor choices since they rapidly dissolve in the solder. Thus, copper, tin, lead, palladium, platinum, or nickel are commonly used for the circuit board terminals, and chrome, titanium, or nickel thin films are commonly used for the integrated circuit terminal.

The solder bumps are placed on the integrated circuit terminals while the die is still in wafer form. The final operation before dicing the wafer is electrical testing, where the soft solder serves to provide a contact pad for the mechanical probes used to contact the terminals.

To join the integrated circuit to the substrate, a flux, either water-white rosin or water soluble flux, is placed on the substrate as a temporary adhesive to hold the integrated circuit in place. The assembly is subjected to a reflow thermal cycle, joining the die to the substrate in an oven or furnace. The surface tension of the solder aids to self align the die to the substrate terminals. After reflow, the flux residue must be removed in order to prevent corrosion of the die. Materials such as chlorinated, fluorinated or hydrocarbon solvents are used to remove the rosin, or water with surfactants is used to remove a water soluble flux. Due to the close proximity of the die to the substrate (typically 0.001 to 0.004 inches), removing the flux residue from under the die is a difficult operation requiring sophisticated cleaning regimes and a significant expenditure of time. Insuring complete removal of all flux residue has been the subject of much effort in the industry.

After cleaning, the assembly is electrically tested, and further packaging is added to provide environmental protection. Passivation, encapsulation, or addition of a cover are the usual methods. In the case of encapsulation, a liquid polymer is applied around and under the die. Historically, the polymers of choice have been silicones and epoxies, with epoxies finding greater favor. The adhesion of epoxies to a ceramic substrate is superior to silicones. The expansion coefficient of epoxies can be lowered with the addition of ceramic fillers. This reduces thermal stresses that develop between the substrate and the encapsulant. The importance of epoxy adhesives with low expansion coefficients cannot be over emphasized for flip chip applications. Cured epoxies are hard and do not posses the flexibility of silicones. Thus, if their expansion coefficients are not lowered with fillers, early device failure can result from crack formation in the die. The use of inorganic fillers also affects thermal conductivity and the level of ionic contaminants.

The very small gap between the die and the substrate must be completely filled in order to provide maximum environmental protection for the device. Previous efforts to seal the device left a voided area in the center of the die, as described in U.S. Pat. No. 4,604,644, where an organic resin is applied around the periphery of the die, and drawn into the space by capillary action. As the size of dies increase, the limiting effect of capillary action becomes more critical and leaves an even greater area of the die unprotected.

Other methods of encapsulating the die surface have attempted to overcome the above limitations by applying the organic resin through a hole in the substrate, located at the center of the die. After the soldering and cleaning operations, the encapsulating resin is applied through the hole and also around the periphery of the die, to insure complete coverage of the die surface. This method suffers from the need to reserve an area in the substrate that is free of circuitry, in order to provide a unused space for the hole.

Clearly, an improved method of encapsulating flip chip integrated circuits that insures complete coverage of the die surface and allows maximum use of the available area of the substrate is needed.

SUMMARY OF THE INVENTION

Briefly, according to the invention, an adhesive material including a fluxing agent is applied to either a substrate having a metallization pattern or a solder bumped electrical component. The component is positioned on the substrate and the solder reflowed. During the reflow step, the fluxing agent promotes adhesion of the solder to the substrate metallization pattern and the adhesive material is cured to mechanically interconnect and encapsulate the substrate and the component.

DETAILED DESCRIPTION OF THE PREFERRED EMBODIMENT

Figure 1:
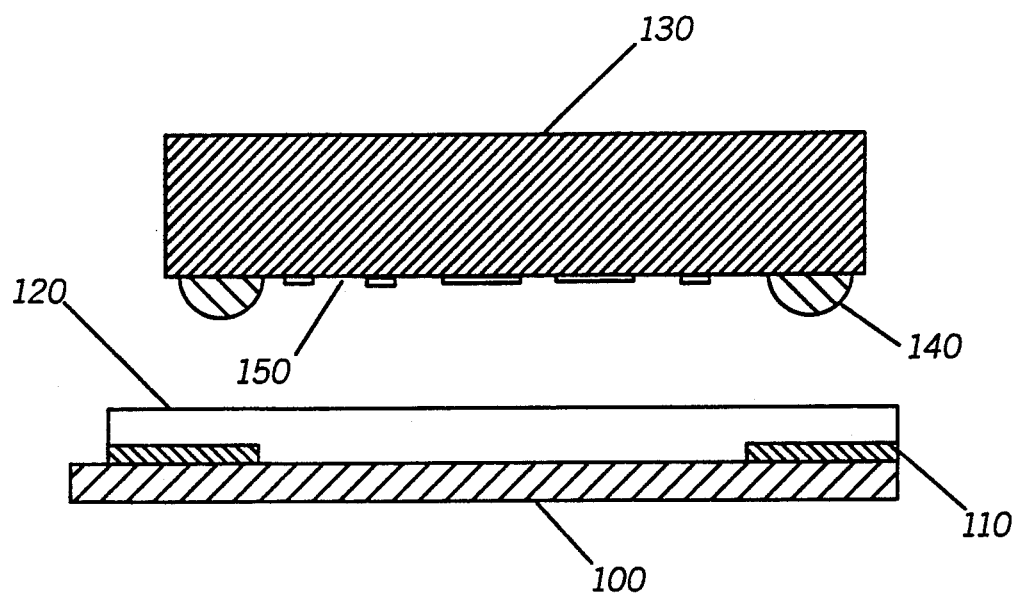
FIG. 1 is a sectioned elevational view of a device prior to attachment to a substrate.

Referring to FIG. 1, a substrate 100 with metallization pattern 110 is selectively coated with an adhesive material 120 by screen printing, stencilling, depositing a preform, or other dispensing means. The adhesive material 120 is formulated to contain a fluxing agent and a curing agent, so that the material does not cure immediately at room temperature. An example of a suitable adhesive material is an epoxy resin made from bisphenol A and epichlorohydrin. The curing agent or hardener may be an amine, an anhydride, or suitable reactant. Other two part resin systems such as polyester resins with suitable hardeners are interchangeable. The purpose of the fluxing agent is to provide fluxing action for the soldering operation. Abietic acid, adipic acid, ascorbic acid, acrylic acid, citric acid, 2-furoic acid, malic acid, and polyacrylic acid were found to be useful as fluxing agents. Other organic acids of the general formula

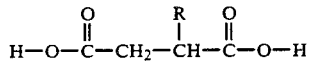

where R is an electron withdrawing group may also be useful. Specific electron withdrawing groups may be fluorine, chlorine, bromine, iodine, sulfur, nitrile, hydroxyl, benzyl or some other electron withdrawing group.

The amount of the fluxing agent in the adhesive material may range from about 0.1 to about 16 weight %, depending on the activity of the particular fluxing agent, the solder alloy selected, and the substrate metallization system.

Figure 2:
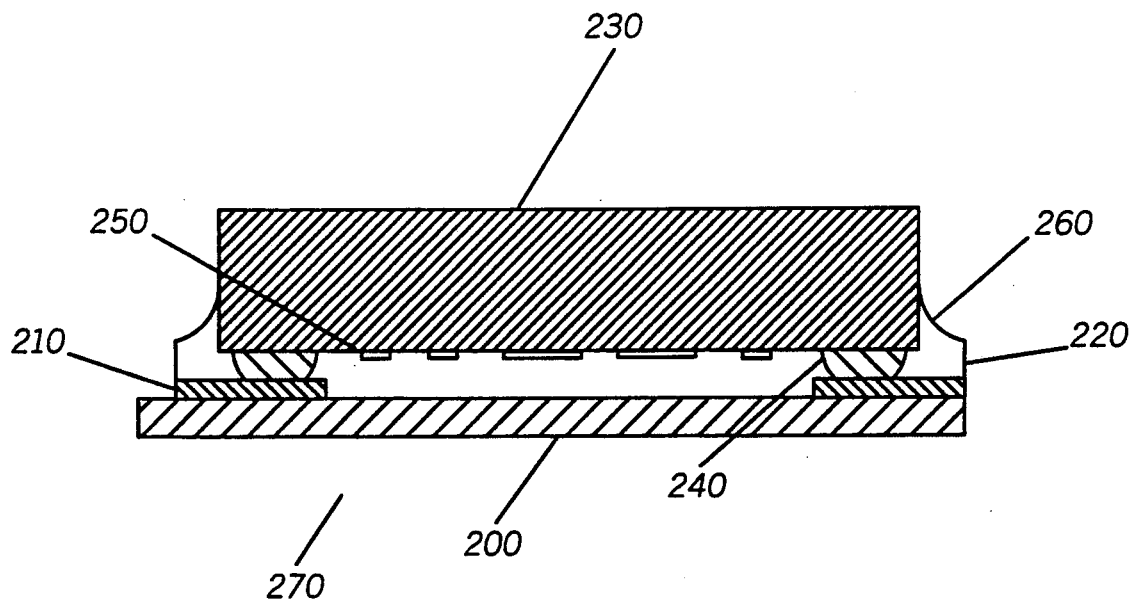
FIG. 2 is a sectioned elevational view of a device after being reflowed to a substrate.

A device 130 containing solder bumps 140 is positioned so that the solder bumps 140 and the active surface 150 are facing the substrate 100 and aligned with the metallization pattern 110 of the substrate 100. Referring to FIG. 2, the bumped device 230 is moved into intimate contact with the metallization pattern 210. The adhesive 220 wets the device 230, insuring complete coverage of the active surface 250 of the device 230. The meniscus 260 provides a continuous seal around the periphery of the device 230 to protect the active surface 250 from environmental contamination. The fluxing agent contained in the adhesive 220 coats the solder bumps 240 and the metallization pattern 210.

It should be appreciated that although the drawings depict the device 130 as an integrated circuit encapsulated and connected to a substrate, embodiments using other types of surface mounted components having solder bumps are within the scope of the invention.

The assembly 270 is reflowed in a conventional manner, causing the fluxing agent to become activated, reducing the oxides on the solder 240 and the metallization surface 210, and permitting alloying of the solder to the metal. During the reflow process, the adhesive 220 is cured to a solid form. Depending on the chemistry of the utilized adhesive system, a second post curing operation may be required to completely cure the adhesive 220. During the reflow/curing step, the device is encapsulated by the adhesive. Since the meniscus 240 provides a continuous seal around the periphery of the device 230 to protect the active surface 250 from environmental contamination, no further cleaning or encapsulating operations are required.

The following examples serve to illustrate a mode of practicing the invention and are not intended to unduly limit the claims thereof.

EXAMPLE 1

An adhesive material containing a fluxing agent and hardener was prepared according to the following formula:

| Component | % by Weight |
| --- | --- |
| Furane 89303 epoxy, Part A | 41 |
| Malic acid | 4.6 |
| Furane 89303 epoxy, Part B | 54.4 |

Furane 89303 epoxy, Part A, is a bisphenol A-epichlorohydrin type epoxy resin available from the Furane Products Company of Los Angeles, Calif. It is formulated for use in encapsulating semiconductor devices. Furane 89303 epoxy, Part B, is an anhydride curing agent or hardener also available from the Furane Products Company. Other types of two part epoxies may also be used to achieve the desired results within the scope of the invention. Equivalent materials are available from companies such as Hysol, Amicon, and Reichhold Chemical.

The malic acid and Part A of the epoxy were added to an aluminum pan. The mixture was heated to about 150° C. with stirring, until the solution became clear. The solution was cooled to room temperature, Part B added to the pan, and the mixture stirred until uniform. A portion of the mixture was coated onto a copper coated polyimide film with a spatula, and spheres of eutectic solder (63% tin, 37% lead) were placed on the surface of the mixture. The polyimide film was heated to a temperature in excess of 185° C. to insure reflow of the solder spheres. After about 30 seconds, the polyimide film was removed from the heat source and cooled to room temperature. The solder spheres were examined under a 30× microscope to determine the extent of reflow and wetting of the spheres to the copper and also to each other.

Approximately one half of the solder spheres coalesced to form a large mass, while the remainder did not coalesce and remained as distinct spheres. This indicated that the solder was not sufficiently wetted to insure complete reflow. The copper surface of the polyimide film was shiny and bright where the adhesive contacted the copper, indicating removal of the copper oxide. The adhesive material was found to be hard and tightly bonded to the copper. Differential Scanning Calorimetry testing of the adhesive indicated that the adhesive was cured.

EXAMPLE 2

Another adhesive material containing a fluxing agent and hardener was prepared according to the following formula:

| Component | % by Weight |
| --- | --- |
| Furane 89303 epoxy, Part A | 43.3 |
| Malic acid | 11.4 |
| Furane 89303 epoxy, Part B | 45.3 |

Example 2 was made and tested in a similar manner as above. The results indicated that approximately 70% of the solder spheres coalesced to a single mass.

EXAMPLE 3

Another adhesive material containing a fluxing agent and hardener was prepared according to the following formula:

| Component | % by Weight |
|---|---|
| Furane 89303 epoxy, Part A | 41 |
| Malic acid | 16 |
| Furane 89303 epoxy, Part B | 43 |

Example 3 was made and tested in a similar manner as above. The results indicated that all of the solder spheres coalesced to a single mass, indicating complete and total wetting of the solder.

EXAMPLE 4

Another adhesive material containing a fluxing agent and hardener was prepared according to the following formula:

| Component | % by Weight |
|---|---|
| Shell Epon 825 epoxy resin | 50 |
| Malic acid | 7 |
| Methylhexahydrophthalic anhydride | 42 |
| Imidazole | 1 |

The malic acid and the epoxy were added to an aluminum pan. The mixture was heated to about 150° C. with stirring, until the solution became clear. The solution was cooled to room temperature, methylhexahydrophthalic anhydride and imidazole added to the pan, and the mixture stirred until uniform.

A portion of the mixture was tested in a similar manner as above. The results indicated that 75% of the solder spheres coalesced to a single mass, indicating incomplete wetting of the solder. This indicated that the solder was not sufficiently wetted to insure complete reflow. The copper surface of the polyimide film was shiny and bright where the adhesive contacted the copper, indicating removal of the copper oxide.

Shell Epon 825 epoxy resin is a high purity bisphenol A-epichlorohydrin epoxy resin with an epoxy equivalent of 175-180, and a viscosity of 5500-6500 centipoise at 25° C. It is available from the Shell Chemical Company of Houston, Tex., and the imidazole is available from Anhydride and Chemicals, Inc, of Newark, N.J.

EXAMPLE 5

Another adhesive material containing a fluxing agent and hardener was prepared according to the following formula:

| Component | % by Weight |
|---|---|
| Furane 89303 epoxy, Part A | 43.5 |
| Malic acid | 12.5 |
| Furane 89303 epoxy, Part B | 44 |

Example 5 was made and tested in a similar manner as above. The results indicated that all of the solder spheres coalesced to a single mass, indicating complete and total wetting of the solder. The use of a lesser amount of fluxing agent as compared to Example 3 was determined to be the preferred embodiment.

The formula of Example 5 was used to coat five test substrates metallized to accept the solder bumped output terminals of flip chip integrated circuits. The bumped integrated circuits were reflowed as described in the embodiment, and electrically tested. All five circuits passed the electrical testing. The soldered assemblies were then subjected to thermal cycling by alternate immersion in a hot liquid bath and a cold liquid bath. The temperature of the heated bath was 125° C. and the temperature of the cold bath was −55° C., with the soldered assemblies residing in each bath for 1 minute before being immediately transferred to the alternate bath. The assemblies were submitted to the same electrical testing regime after 1, 5, 10, 25, 50, 100, 125, 175, and 200 thermal cycles. All five assemblies passed the electrical testing through 175 thermal cycles, and one assembly failed testing at 200 cycles.

The formula of Example 5 was also used to coat three test substrates metallized to accept the solder bumped output terminals of flip chip integrated circuits. The bumped integrated circuits were reflowed as described in the embodiment, and subjected to mechanical testing. The anvil of a force measuring tool was placed against the side of the integrated circuit and the force necessary to dislodge the integrated circuit from the substrate was recorded. The forces ranged from 3.8 to 4.7 Newtons, with the mean force equal to 3.9 Newtons.

An adhesive with fluxing properties can be used to reflow solder and encapsulate surface mounted components, and flip chip integrated circuits in particular, while providing environmental protection of the active surface of the integrated circuit.

What is claimed is:

1. A thermally curable adhesive having a fluxing agent for use in reflow soldering an electrical component and a substrate, comprising an adhesive that removes oxide coatings from the electrical component or the substrate and at least partially cures when heated to soldering temperatures, said adhesive consisting essentially of a thermoset resin, a fluxing agent in an amount sufficient to remove said oxide coatings from said component or said substrate, and a curing agent that reacts with and cures the thermoset resin when the thermally curable adhesive is heated.

2. The adhesive of claim 1, wherein the thermoset resin is epoxy or polyester.

3. The adhesive of claim 1, wherein the fluxing agent comprises a compound having the formula:

where R is an electron withdrawing group.

4. The fluxing agent of claim 3, wherein R is selected from the group consisting of fluorine, chlorine, bromine, iodine, sulfur, hydroxyl, nitrile, and benzyl.

5. The adhesive of claim 1, wherein the fluxing agent is malic acid.

6. The adhesive of claim 1, wherein the proportion of the fluxing agent in the adhesive ranges from about 0.1 to about 16 weight % of the adhesive.

7. An electrical component assembly, comprising;
an electrical component having a plurality of electrical terminations, each termination including a solder bump, a component carrying substrate having a plurality of electrical terminations corresponding to the terminations of the electrical component, a thermally curable adhesive material that removes oxide coatings from the component plurality of electrical terminations and the substrate plurality of electrical terminations when heated to soldering temperatures, comprising;

an epoxy resin, a curing agent that reacts with and cures the epoxy resin when the thermally curable adhesive is heated, and a fluxing agent in an amount sufficient to remove said oxide coatings from said component terminations or said substrate terminations, the adhesive material disposed between and bonding the electrical component and the substrate, the solder bump being reflowed and electrically connecting the electrical component to the substrate.

8. The electrical component assembly of claim 7, wherein the fluxing agent comprises a compound having the formula:

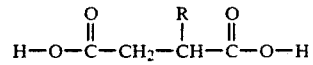

where R is an electron withdrawing group.

9. The fluxing agent of claim 8, wherein R is selected from the group consisting of fluorine, chlorine, bromine, iodine, sulfur, hydroxyl, nitrile, and benzyl.

10. The fluxing agent of claim 8, wherein the compound is malic acid.

11. The electrical component assembly of claim 7, wherein the proportion of the fluxing agent in the adhesive ranges from about 0.1 to about 16 weight % of the adhesive material.

12. The electrical component assembly of claim 7, wherein the component is an integrated circuit.

* * * * *